(12) United States Patent
Jeong et al.

(10) Patent No.: US 9,294,007 B2
(45) Date of Patent: Mar. 22, 2016

(54) GATE DRIVING CIRCUIT AND INVERTER HAVING THE SAME

(71) Applicant: SAMSUNG ELECTRO-MECHANICS CO., LTD., Suwon, Gyunggi-do (KR)

(72) Inventors: In Wha Jeong, Gyunggi-do (KR); Bum Seok Suh, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 447 days.

(21) Appl. No.: 13/768,909

(22) Filed: Feb. 15, 2013

(65) Prior Publication Data

US 2014/0098586 A1    Apr. 10, 2014

(30) Foreign Application Priority Data

Oct. 4, 2012    (KR) .................. 10-2012-0109959

(51) Int. Cl.
*H02M 7/537*    (2006.01)
*H02M 1/08*    (2006.01)
*H02M 7/5387*    (2007.01)
(Continued)

(52) U.S. Cl.
CPC .............. *H02M 7/537* (2013.01); *H02M 1/08* (2013.01); *H02M 7/5387* (2013.01); *H03K 17/08148* (2013.01); *H03K 17/107* (2013.01);
(Continued)

(58) Field of Classification Search
CPC   H02M 7/537; H02M 7/5387; H02M 7/53871
USPC ..................... 363/97, 98, 131, 132
See application file for complete search history.

(56) References Cited

U.S. PATENT DOCUMENTS 5,361,196 A    11/1994    Tanamachi et al.
6,256,215 B1 *  7/2001    Barrett et al. .................. 363/132
(Continued)

FOREIGN PATENT DOCUMENTS

CN    1914576 A    2/2007
CN    102035422 A    4/2011
(Continued)

OTHER PUBLICATIONS

Office Action issued on Feb. 18, 2014 in the corresponding Japanese Patent Application No. 2013-028237.
(Continued)

*Primary Examiner* — Jessica Han
(74) *Attorney, Agent, or Firm* — McDermott Will & Emery LLP

(57) ABSTRACT

There is provided an inverter including: an inverter unit including at least one inverter arm having a plurality of switches, and switching the input power according to control to output an alternating current power; at least one driving unit including at least one high voltage gate driving unit having a plurality high voltage gate drivers connected to one another in series between an input terminal of an instruction signal instructing a switching control of an inverter unit and an output terminal of a control signal controlling switching of the inverter unit to control switching driving of a high side switch and including at least one low voltage gate driver to control switching driving of a low side switch; and at least one bootstrap unit charging/discharging and dividing a voltage generated at the time of switching the plurality of switches according to switching control of the driving unit.

16 Claims, 5 Drawing Sheets

(51) Int. Cl.
  *H03K 17/0814* (2006.01)
  *H03K 17/10* (2006.01)
  *H03K 17/74* (2006.01)
  *H02M 7/487* (2007.01)
  *H02M 1/00* (2007.01)

(52) U.S. Cl.
  CPC .............. *H03K 17/74* (2013.01); *H02M 7/487* (2013.01); *H02M 2001/0006* (2013.01)

(56) References Cited

U.S. PATENT DOCUMENTS

| | | | |
|---|---|---|---|
| 7,684,217 B2 | 3/2010 | Nakata et al. | |
| 8,472,223 B2* | 6/2013 | Truettner | 363/132 |
| 2005/0116744 A1 | 6/2005 | Iwagami et al. | |
| 2005/0168206 A1 | 8/2005 | Nadd | |
| 2006/0119414 A1* | 6/2006 | Gotou et al. | 327/427 |
| 2007/0159749 A1 | 7/2007 | Oka | |
| 2009/0195068 A1* | 8/2009 | Ohashi et al. | 307/18 |
| 2011/0074489 A1* | 3/2011 | Viitanen et al. | 327/427 |
| 2011/0157949 A1* | 6/2011 | Bahramian | 363/132 |
| 2014/0112039 A1* | 4/2014 | Correa Vasquez et al. | 363/98 |

FOREIGN PATENT DOCUMENTS

| | | |
|---|---|---|
| JP | 2003-348880 A | 12/2003 |
| JP | 2005-006467 A | 1/2005 |
| JP | 2007185064 A | 7/2007 |
| KR | 2005-0052339 A | 6/2005 |

OTHER PUBLICATIONS

International IOR Rectifier Application note AN-978 (title : HV Floating MOS-Gate Drive ICs) (publication date: Mar. 23, 2007).
Korean Office Action issued in Application No. 10-2012-0109959 dated Aug. 29, 2013.
Notification of the First Office Action issued in corresponding Chinese Patent Application No. 2013100661635, mailed on Aug. 21, 2015; with English translation.

* cited by examiner

GATE DRIVING CIRCUIT AND INVERTER HAVING THE SAME

CROSS-REFERENCE TO RELATED APPLICATIONS

This application claims the priority of Korean Patent Application No. 10-2012-0109959 filed on Oct. 4, 2012, in the Korean Intellectual Property Office, the disclosure of which is incorporated herein by reference.

BACKGROUND OF THE INVENTION

1. Field of the Invention

The present invention relates to a gate driving circuit driven at a high voltage and an inverter having the same.

2. Description of the Related Art

Generally, an inverter, a circuit receiving direct current (DC) power and outputting alternating current (AC) power, may control voltage magnitude, frequency, or the like, of output AC power to output the controlled AC power or drive a motor.

The above-mentioned inverter may be widely used domestically, commercially, industrially, or the like.

In order to drive the above-mentioned inverter, a driving apparatus may be employed, wherein the driving apparatus may drive the inverter so that a switch of an arm for providing the alternating current power in the inverter is turned on or turned off to provide the AC power.

Meanwhile, the inverter may be used in domestic settings as well as in industrial settings, where high voltage alternating current power may be necessary due to characteristics of the industrial inverter.

A general inverter may employ gate driving integrated circuits controlling turning on and turning off of each of a high side switch and a low side switch of an inverter arm, wherein the gate driving integrated circuit controlling the turning on and turning off of the high side switch should have withstand-voltage characteristics capable of withstanding a high voltage level due to the high voltage applied to the high side switch.

However, in the case of the industrial inverter, a high voltage of about 800V or more may be applied to the high side switch and the withstand-voltage characteristics of the high voltage gate driving integrated circuit controlling the driving of the high side switch need to withstand the voltage level of 800V or more, and the high voltage gate driving integrated circuit having the above-mentioned withstand-voltage characteristics has high manufacturing costs.

RELATED ART DOCUMENT

Korean Patent Laid-Open Publication No. 10-2005-0052339

SUMMARY OF THE INVENTION

An aspect of the present invention provides a high voltage gate driving circuit having low manufacturing costs and a high voltage inverter having the same.

According to an aspect of the present invention, there is provided a gate driving circuit, including: at least one gate driving unit including at least one high voltage gate driving unit having a plurality of high voltage gate drivers connected to one another in series between an input terminal of an instruction signal instructing a switching control of an inverter unit including at least one inverter arm having a plurality of switches and switching input power according to a control to output alternating current (AC) power and an output terminal of a control signal controlling switching of the inverter unit to thereby control gate driving of a high side switch of the plurality of switches and including at least one low voltage gate driver to control the gate driving of a low side switch of the plurality of switches; and at least one bootstrap unit dividing a voltage generated at the time of switching the plurality of switches to apply the divided voltage to respective switches according to switching control of the gate driving unit.

The inverter arm may include the high side switch, first and second middle side switches, and the low side switch sequentially connected in series between the input power terminal and a ground.

The gate driving unit may include: a first high voltage gate driving unit having the plurality of high voltage gate drivers connected to one another in series between the input terminal of the instruction signal and the output terminal of the control signal and controlling switching of the high side switch; a second high voltage gate driving unit having a plurality of high voltage gate drivers connected to one another in series between the input terminal of the instruction signal and the output terminal of the control signal and controlling switching of the first middle side switch; a high voltage gate driver controlling switching of the second middle side switch; and a low voltage gate driver controlling switching of the low side switch.

The bootstrap unit may include: a capacitor group including a first capacitor connected between a driving power terminal of a high voltage gate driver of the last stage of the first high voltage gate driving unit and the ground, a second capacitor connected between a driving power terminal of a high voltage gate driver of the last stage of the second high voltage gate driving unit and the ground, and a third capacitor connected between a driving power terminal of a high voltage gate driver controlling switching of the second middle side switch and the ground and connected to a driving power input terminal inputting the driving power to the high voltage gate driver of the last stage of the first high voltage gate driving unit and a driving power input terminal inputting the driving power to the high voltage gate driver of the last stage of the second high voltage gate driving unit; and a diode group including a first diode connected between the driving power terminal of the high voltage gate driver of the last stage of the first high voltage gate driving unit and the driving power terminal of the high voltage driver of the last stage of the second high voltage gate driving unit, a second diode connected between the driving power terminal of the high voltage gate driver of the last stage of the second high voltage gate driving unit and the driving power terminal of the high voltage gate driver controlling the switching of the second middle side switch, and a third diode connected between the driving power terminal of the high voltage gate driver controlling the switching of the second middle side switch and a driving power terminal of the low voltage gate driver.

The gate driving circuit may include: a first operating mode switching the high side switch and the first middle side switch on and switching the second middle side switch and the low side switch off to thereby output alternating current power having a positive voltage level from the inverter unit and charge the first capacitor with the power; a second operating mode switching the first and second middle side switches on and switching the high side switch and the low side switch off to thereby output the alternating current power having zero voltage level and charge the first and second capacitors with the power; and a third operating mode switching the second middle side switch and the low side switch on and switching the high side switch and the first middle side switch off to thereby output the alternating current power having a negative voltage level and charge the second and third capacitors with the power.

The first capacitor may receive the power from the second capacitor to thereby be charged with the received power, at the time of an operation in the first operating mode, the first and second capacitors may receive the power from the third capacitor to thereby to be charged with the received power, at the time of an operation in the second operating mode, and the second and third capacitors may receive the driving power to thereby be charged with the driving power, at the time of an operation in the third operating mode.

The gate driving circuit may include: a first operating mode switching the high side switch and the low side switch on and switching the first and second middle side switches off to thereby charge the third capacitor with the power, a second operating mode switching the first middle side switch on and switching the high side switch off, the low side switch, and the second middle side switch to thereby charge the first capacitor with the power, a third operating mode switching the second middle side switch on and switching the high side switch, the lower side switch, and the first middle side switch off to thereby charge the second capacitor with the power, and a fourth operating mode switching the low side switch on and switching the high side switch and the first and second middle side switches off to thereby charge the third capacitor with the power.

The third capacitor may receive the driving power to thereby be charged with the received driving power, at the time of an operation in the first operating mode, the first capacitor may receive the power from the second capacitor to thereby be charged with the power, at the time of an operation in the second operating mode, the second capacitor receives the power from the third capacitor to thereby be charged with the power, at the time of an operation in the third operating mode, and the third capacitor may receive the driving power to thereby be charged with the driving power, at the time of an operation in the fourth operating mode.

The inverter unit may include three inverter arms connected to each other in parallel.

The gate driving circuit may further include first, second, and third gate driving units driving the switches of the three inverter arms.

The gate driving circuit may further include first, second, and third bootstrap units dividing a voltage generated at the time of switching the plurality of switches of the three inverter arms to apply the divided voltage to each switch and dividing the voltage applied to the first, second, and third gate driving units.

According to another aspect of the present invention, there is provided an inverter, including: an inverter unit including at least one inverter arm having a high side switch, first and second middle side switches, and a low side switch sequentially connected in series between an input power terminal providing input power having preset voltage level and a ground, and switching the input power according to control to output an alternating current power; at least one gate driving unit having a first high voltage gate driving unit having a plurality of high voltage gate drivers connected to one another in series between an input terminal of an instruction signal instructing switching control of the inverter unit and an output terminal of a control signal controlling switching of the inverter unit and controlling gate driving of the high side switch, a second high voltage gate driving unit having a plurality of high voltage gate drivers connected to one another in series between the input terminal of the instruction signal and the output terminal of the control signal and controlling gate driving of the first middle side switch, a high voltage gate driver controlling gate driving of the second middle side switch, and a low voltage gate driver controlling gate driving of the low side switch; and at least one bootstrap unit dividing a voltage generated at the time of switching the plurality of switches to apply the divided voltage to respective switches according to switching control of the gate driving unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
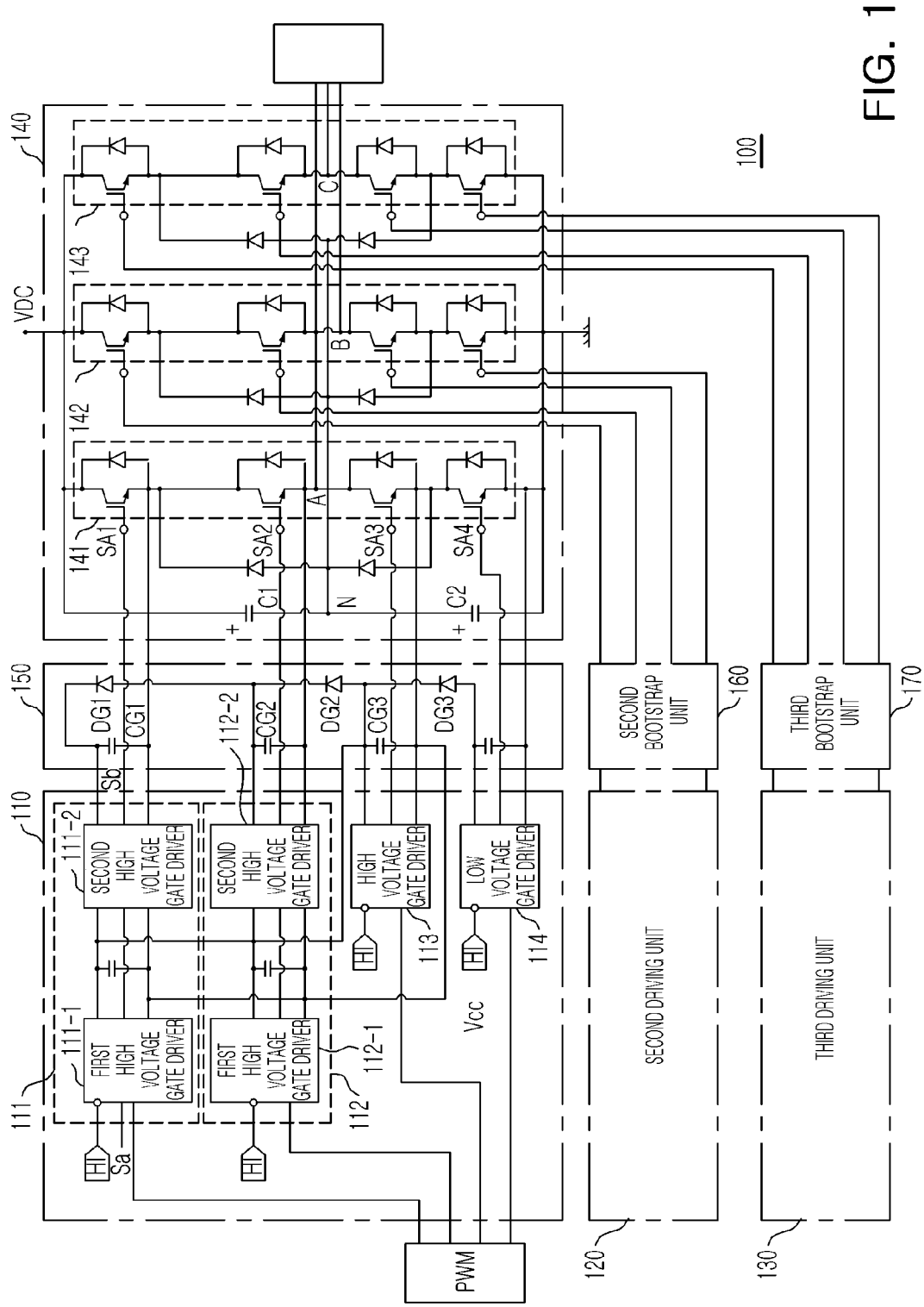
FIG. 1 is a schematic circuit view of an inverter according to an embodiment of the present invention.
Figure 2A:
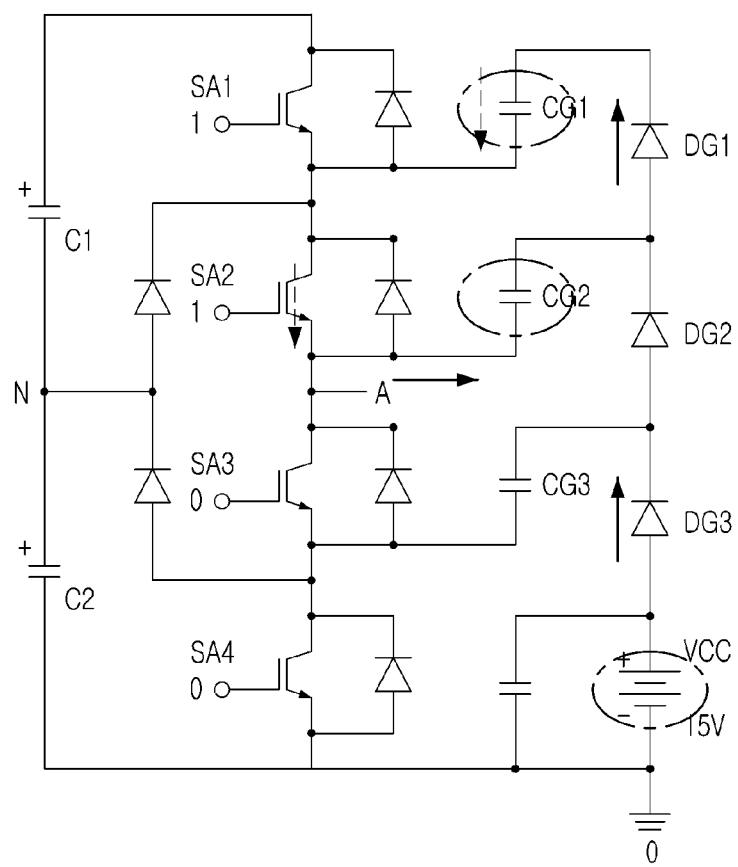
FIGS. 2A through 2D are views showing schematic charging operations of bootstrap units employed in the inverter according to the embodiment of the present invention.
Figure 2B:
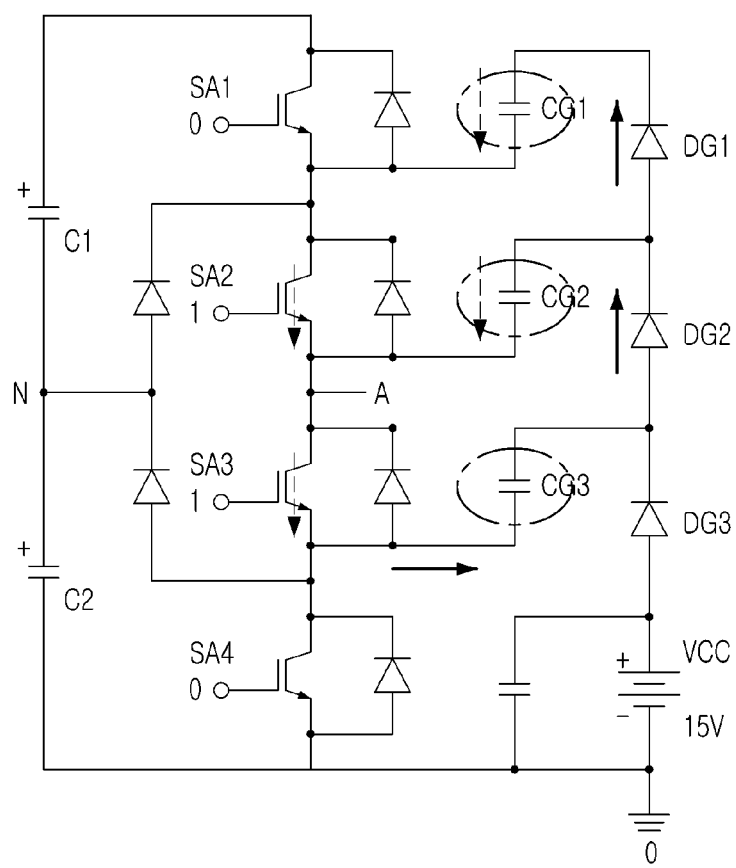
Figure 2C:
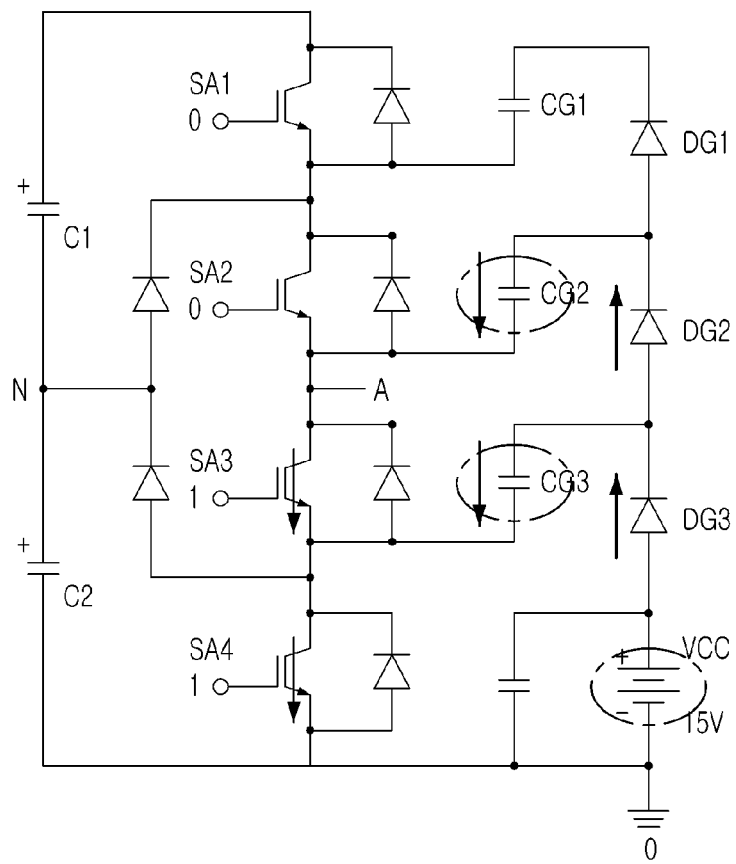
Figure 2D:
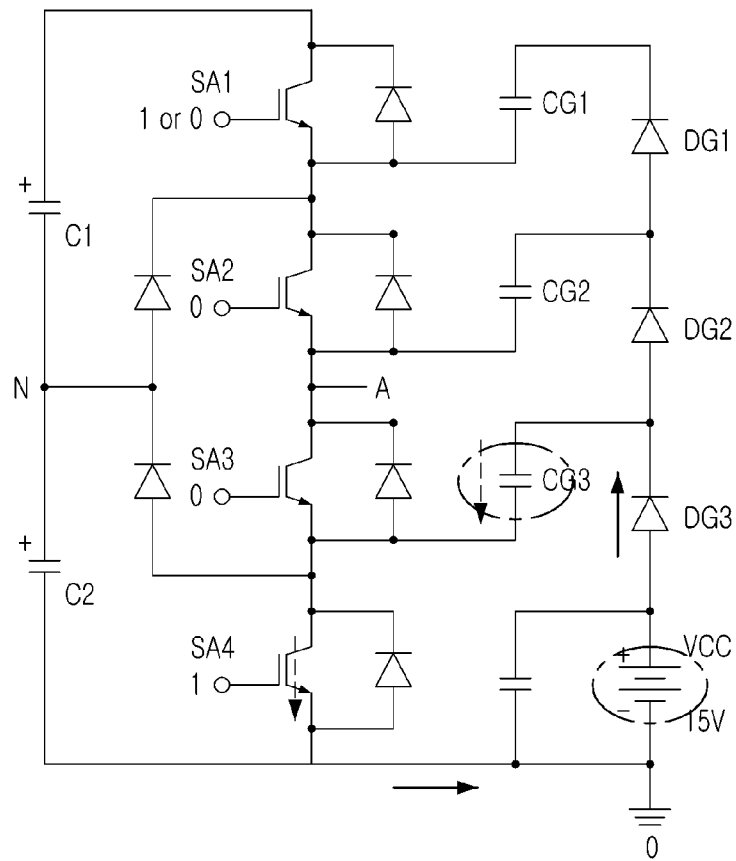

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

FIG. 1 is a schematic circuit view of an inverter according to an embodiment of the present invention.

Referring to FIG. 1, the inverter 100 according to an embodiment of the present invention may include at least one or more gate driving units 110, 120, and 130, an inverter unit 140, and at least one bootstrap units 150, 160, and 170.

First, the inverter unit 140 may include at least one inverter arm switching an input power to thereby output alternating current power, wherein one inverter arm is required for the case in which single phase alternating current power is output. Therefore, the inverter 100 according to the embodiment of the present invention may include one driving unit 110 and one bootstrap unit 150.

In addition, in the case in which the inverter unit 140 output three phase alternating current power, since one inverter arm is required for each phase, the inverter unit 140 may include at least three inverter arms. Therefore, the inverter 100 according to the embodiment of the present invention may include first to third gate driving units 110, 120, and 130 driving respective inverter arms and include first to third bootstrap units 150, 160, and 170 for dividing a voltage generated at the time of switching the inverter arm to apply the divided voltage to the first to third gate driving units 110, 120, and 130.

The first to third gate driving units 110, 120, and 130 have the same configurations and functions. Therefore, a description will be provided based on the first gate driving unit 110.

The first gate driving unit 110 may include at least one or more high voltage gate driving units 111 and 112, a high voltage gate driver 113, and a low voltage gate driver 114. In the case in which inverter arms 141, 142, and 143 of the inverter unit 140 include a high side switch SA1, first and second middle side switches SA2 and SA3, and a low side switch SA4 sequentially connected to one another in series, the first gate driving unit 110 may include first and second high voltage gate driving units 111 and 112.

The first and second high voltage gate driving units 111 and 112 may each include a plurality of high voltage gate drivers 111-1 and 111-2, and 112-1 and 112-2 and connected to each other in series between an instruction signal input terminal to which an instruction signal PWM instructing a switching control is input and a control signal output terminal from which a control signal Sb controlling switching of the inverter unit 140 is output. The high voltage gate driving unit 111 may control the switching of the inverter unit 140. Therefore, when the instruction signal Sa is input to the first high voltage gate driver 111-1, information regarding the switching control included in the instruction signal Sa is transferred to a high voltage gate driver of a later stage, and an N-th high voltage gate driver 111-N of the last stage transfers the control signal Sb corresponding to an intention of the switching control that the instruction signal Sa input to the first high voltage gate driver 111-1 desires to control to the inverter unit 140, whereby the switching of the inverter unit 140 may be controlled. Here, although only the first and second high voltage gate drivers are shown for convenience in describing the drawings, the present invention is not limited thereto.

As described above, the bootstrap units 150, 160, and 170 may equally divide the voltage generated at the time of switching a plurality of switches of the inverter unit 140, according to the switching control of the gate driving unit to thereby equally divide a voltage level of the power that may be applied to the plurality of high voltage gate drivers 111-1, 111-2, 112-1, and 112-2 of the first to third gate driving units 110, 120, and 130. Therefore, for example, the input power VDC having the voltage level of 1200V or more is input and the voltage level of the applied power is equally divided according to the switching on and switching off of a plurality of switches of the inverter unit 140, such that two high voltage gate drivers 111-1 and 111-2 each having the withstand-voltage of 600V are connected to each other in series as shown in FIG. 1 or three high voltage gate drivers each having the withstand-voltage of 400V are connected to each other in series although not shown to replace the relatively expensive high voltage gate driver of 1200V, whereby the manufacturing costs thereof may be decreased.

The bootstrap units 150, 160, and 170 may be first to third bootstrap units 150, 160, and 170 corresponding to the first to third driving units 110, 120, and 130, respectively and since the first to third bootstrap units 150, 160, and 170 may have the same configuration, the first bootstrap unit 150 will be described in detail.

The first bootstrap unit 150 may include a capacitor group having a first capacitor CG1 connected between a driving power terminal of a high voltage gate driver (for example, the second high voltage gate driver 112-2 shown in FIG. 1) of the last stage of the first high voltage gate driving unit 111 of the first driving unit 110 and a ground; a second capacitor CG2 connected between a driving power terminal of a high voltage gate driver (for example, the second high voltage gate driver 112-2 shown in FIG. 1) of the last stage of the second high voltage gate driving unit 112 and the ground; and a third capacitor CG3 connected between a driving power terminal of a high voltage gate driver 113 controlling switching a second middle side switch SA3 and the ground, and connected to a driving power input terminal through which the driving power is input to the high voltage gate driver 111-2 of the last stage of the first high voltage gate driving unit 111 and a driving power input terminal through which the driving power is input to the high voltage gate driver 112-2 of the last stage of the second high voltage gate driving unit 112.

In addition, the first bootstrap unit 150 may include a diode group having a first diode DG1 connected between the driving power terminal of the high voltage gate driver 111-2 of the last stage of the first high voltage gate driving unit 111 of the first driving unit 110 and the driving power terminal of the high voltage driver 112-2 of the last stage of the second high voltage gate driving unit 112; a second diode DG2 connected between the driving power terminal of the high voltage gate driver 112-2 of the last stage of the second high voltage gate driving unit 112 and the driving power terminal of the high voltage gate driver 113; and a third diode DG3 connected between the driving power terminal of the high voltage gate driver 113 and a driving power terminal of a low voltage gate driver 114.

FIGS. 2A through 2D are views showing schematic charging operations of bootstrap units employed in the inverter according to the embodiment of the present invention.

Referring to FIGS. 2A through 2D, although the first inverter arm 141 among the three arms of the inverter unit 140 is shown, operations of the remaining second and third inverter arms 142 and 143 are the same as those of the first inverter arm 141, and there is only a phase difference of the power of 120°. Therefore, only the first inverter arm 141 will be described. Similarly, the first to third bootstrap units 150, 160, and 170 are responsible for the first to third inverter arms 141, 142, and 143, respectively, and the first to third bootstrap units 150, 160, and 170 perform the same operation as described above. Therefore, only the first bootstrap unit 150 responsible for the first inverter arm 141 will be described.

The switches SA1, SA2, SA3, and SA4 of the first inverter arm 141 and the first bootstrap unit 150 may operate in first to third operating modes or first to fourth operating modes.

First, in the case of the first to third operating modes, describing the first operating mode, the high side switch SA1 and the first middle side switch SA2 are switched on and the second middle side switch SA3 and the low side switch SA4 are switched off, such that the alternating current power having a positive voltage level may be output from the first inverter arm 141 of the inverter unit 140 and the first capacitor CG1 may be charged with the power. At the time of an operation in the first operating mode, the first capacitor CG1 may receive the power from the second capacitor CG2 to thereby be charged with the received power.

Describing the second operating mode, the first and second middle side switches SA2 and SA3 are switched on, and the high side switch SA1 and the low side switch SA4 are switched off, such that the alternating current power having a zero voltage level may be output from the inverter unit 140 and the first and second capacitors CG1 and CG2 may be charged. At the time of an operation in the second operating mode, the first and second capacitors CG1 and CG2 may receive the power from the third capacitor CG3 to thereby be charged with the received power.

Describing the third operating mode, the second middle side switch SA3 and low side switch SA4 are switched on, and the high side switch SA1 and the first middle side switch SA2 are switched off, such that the alternating current power having a negative voltage level may be output from the first inverter arm 141 of the inverter unit 140, and the second and third capacitors CG2 and CG3 may be charged with the power. At the time of an operation in the third operating mode, the second and third capacitors CG2 and CG3 may directly receive driving power Vcc to thereby be charged with the driving power Vcc.

The operations described above are simply summarized as shown in the following Table 1.

TABLE 1

| MODE | SWITCHING | | | | PHASE VOLTAGE (VAN) | POWER SOURCE CHARGING BOOTSTRAP CAPACITOR | CHARGED BOOTSTRAP CAPACITOR |
|---|---|---|---|---|---|---|---|
| | SA1 | SA2 | SA3 | SA4 | | | |
| 1 | 1 | 1 | 0 | 0 | +VDC/2 | CG2 | CG1 |
| 2 | 0 | 1 | 1 | 0 | 0 | CG3 | CG2, CG1 |
| 3 | 0 | 0 | 1 | 1 | −VDC/2 | Vcc | CG3, CG2 |

Maximum gate voltages capable of being applied to the switch of the first inverter arm 141 are summarized as shown in the following Table 2.

TABLE 2

| SWITCHING | GATE DRIVE POWER SUPPLY | MAXIMUM GATE DRIVE VOLTAGE |
|---|---|---|
| SA1 | VCG1 | Vcc − (VF − DG1 + VF − DG2 + VF − DG3 + VCE(sat) − SA2 + VCE(sat) − SA3 + VCE(sat) − SA4) |
| SA2 | VCG2 | Vcc − (VF − DG2 + VF − DG3 + VCE(sat) − SA3 + VCE(sat) − SA4) |
| SA3 | VCG3 | Vcc − (VF − DG3 + VCE(sat) − SA4) |
| SA4 | Vcc | Vcc |

Next, in the case of the first to fourth operating modes, describing the first operating mode, the high side switch SA1 and the low side switch SA4 are switched on, and the first and second middle side switches SA2 and SA3 are switched off, such that the third capacitor CG3 may be charged with the power. At the time of an operation in the first operating mode, the third capacitor CG3 may directly receive driving power Vcc to thereby be charged with the driving power Vcc.

Describing the second operating mode, the first middle side switch SA2 is switched on, and the high side switch SA1, the low side switch SA4, and the second middle side switch SA3 are switched off, such that the first capacitor CG1 may be charged with the power. At the time of an operation in the second operating mode, the first capacitor CG1 may receive the power from the second capacitor CG2 to thereby be charged with the received power.

Describing the third operating mode, the second middle side switch SA3 is switched on, and the high side switch SA1, the low side switch SA4, and the first middle side switch SA2 are switched off, such that the second capacitor CG2 may be charged with the power. At the time of an operation in the third operating mode, the second capacitor CG2 may receive the power from the third capacitor CG3 to thereby be charged with the received power.

Describing the fourth operating mode, a low side switch SA4 is switched on, and the high side switch SA1 and the first and second middle side switches SA2 and SA3 are switched off, such that the third capacitor CG3 may be charged with the power. At the time of an operation in the fourth operating mode, the third capacitor CG3 may directly receive driving power Vcc to thereby be charged with the driving power Vcc.

The operations described above are simply summarized as shown in the following Table 3.

TABLE 3

| MODE | SWITCHING | | | | POWER SOURCE CHARGING BOOTSTRAP CAPACITOR | CHARGED BOOTSTRAP CAPACITOR |
|---|---|---|---|---|---|---|
| | SA1 | SA2 | SA3 | SA4 | | |
| 1 | 1 | 0 | 0 | 1 | Vcc | CG3 |
| 2 | 0 | 1 | 0 | 0 | CG2 | CG1 |
| 3 | 0 | 0 | 1 | 0 | CG3 | CG2 |
| 4 | 0 | 0 | 0 | 1 | Vcc | CG3 |

Figure 3:
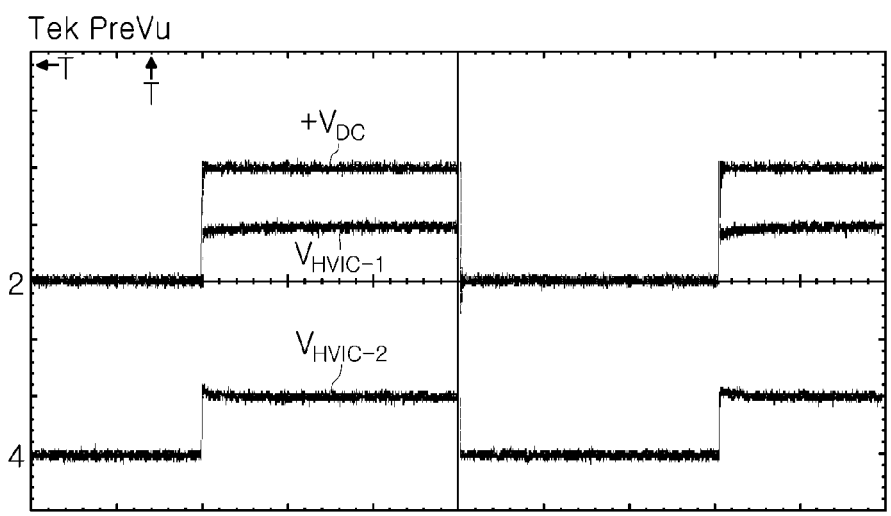
FIG. 3 is a voltage waveform showing electrical characteristics of the inverter according to the embodiments of the present invention.

FIG. 3 is a voltage waveform showing electrical characteristics of the inverter according to the embodiments of the present invention.

As shown in FIG. 3, it may be appreciated that in the case in which the input power VDC is 1200V based on the inverter 100 according to the embodiment of the present invention shown in FIG. 1, the voltage level of the power applied according to the switching on and switching off of the high side switch may be equally divided by 600V and applied to the high voltage gate drivers 111-1 and 111-2, respectively to thereby employ the high voltage gate driver having the withstand-voltage of 600V in the inverter circuit having the input power of 1200V.

As set forth above, according to the embodiments of the present invention, in the case in which input power of approximately 800V is switched, a plurality of driving circuits having withstand-voltage characteristics lower than 800V are connected to one another in series and the voltage applied to the plurality of driving circuits at the time of the switching is divided to stably operate the driving circuits, such that a relatively expensive driving circuit having the withstand-voltage of 800V may be replaced by the driving circuits according to the embodiment of the present invention, whereby the manufacturing costs thereof may be decreased.

In addition, the single power is supplied to the plurality of driving circuits, whereby the configuration of the circuit may become simple and the manufacturing costs thereof may be further decreased.

While the present invention has been shown and described in connection with the embodiments, it will be apparent to those skilled in the art that modifications and variations can be made without departing from the spirit and scope of the invention as defined by the appended claims.

What is claimed is:

1. A gate driving circuit, comprising:
   at least one gate driving unit including at least one high voltage gate driving unit having a plurality of high voltage gate drivers connected to one another in series between an input terminal of an instruction signal instructing a switching control of an inverter unit including at least one inverter arm having a plurality of switches and switching input power according to a control to output alternating current (AC) power and an output terminal of a control signal controlling switching of the inverter unit to thereby control gate driving of a high side switch of the plurality of switches, and including at least one low voltage gate driver to control the gate driving of a low side switch of the plurality of switches; and at least one bootstrap unit dividing a voltage generated at the time of switching the plurality of switches to apply the divided voltage to respective switches according to switching control of the gate driving unit, wherein the inverter arm includes the high side switch, first and second middle side switches, and the low side switch sequentially connected in series between the input power terminal and a ground, wherein the gate driving unit includes:

a first high voltage gate driving unit having the plurality of high voltage gate drivers connected to one another in series between the input terminal of the instruction signal and the output terminal of the control signal, and controlling switching of the high side switch;

a second high voltage gate driving unit having the plurality of high voltage gate drivers connected to one another in series between the input terminal of the instruction signal and the output terminal of the control signal, and controlling switching of the first middle side switch;

a high voltage gate driver controlling switching of the second middle side switch; and a low voltage gate driver controlling switching of the low side switch, wherein the bootstrap unit includes:

a capacitor group including a first capacitor connected between a driving power terminal of a high voltage gate driver of the last stage of the first high voltage gate driving unit and the ground, a second capacitor connected between a driving power terminal of the high voltage gate driver of the last stage of the second high voltage gate driving unit and the ground, and a third capacitor connected between a driving power terminal of a high voltage gate driver controlling switching of the second middle side switch and the ground and connected to a driving power input terminal inputting the driving power to the high voltage gate driver of the last stage of the first high voltage gate driving unit and a driving power input terminal inputting the driving power to the high voltage gate driver of the last stage of the second high voltage gate driving unit; and a diode group including a first diode connected between the driving power terminal of the high voltage gate driver of the last stage of the first high voltage gate driving unit and the driving power terminal of the high voltage driver of the last stage of the second high voltage gate driving unit, a second diode connected between the driving power terminal of the high voltage gate driver of the last stage of the second high voltage gate driving unit and the driving power terminal of the high voltage gate driver controlling the switching of the second middle side switch, and a third diode connected between the driving power terminal of the high voltage gate driver controlling the switching of the second middle side switch and a driving power terminal of the low voltage gate driver.

2. The gate driving circuit of claim 1, wherein the gate driving circuit includes:

a first operating mode switching the high side switch and the first middle side switch on and switching the second middle side switch and the low side switch off to thereby output alternating current power having a positive voltage level from the inverter unit and charge the first capacitor with the power;

a second operating mode switching the first and second middle side switches on and switching the high side switch and the low side switch off to thereby output the alternating current power having zero voltage level and charge the first and second capacitors with the power; and a third operating mode switching the second middle side switch and the low side switch on and switching the high side switch and the first middle side switch off to thereby output the alternating current power having a negative voltage level and charge the second and third capacitors with the power.

3. The gate driving circuit of claim 2, wherein the first capacitor receives the power from the second capacitor to thereby be charged with the received power, at the time of an operation in the first operating mode, the first and second capacitors receive the power from the third capacitor to thereby to be charged with the received power, at the time of an operation in the second operating mode, and the second and third capacitors receive the driving power to thereby be charged with the driving power, at the time of an operation in the third operating mode.

4. The gate driving circuit of claim 2, wherein the third capacitor receives the driving power to thereby be charged with the received driving power, at the time of an operation in the first operating mode, the first capacitor receives the power from the second capacitor to thereby be charged with the power, at the time of an operation in the second operating mode, the second capacitor receives the power from the third capacitor to thereby be charged with the power, at the time of an operation in the third operating mode, and the third capacitor receives the driving power to thereby be charged with the driving power, at the time of an operation in the fourth operating mode.

5. The gate driving circuit of claim 1, wherein the gate driving circuit includes:

a first operating mode switching the high side switch and the low side switch on and switching the first and second middle side switches off to thereby charge the third capacitor with the power, a second operating mode switching the first middle side switch on and switching the high side switch, the low side switch, and the second middle side switch off to thereby charge the first capacitor with the power, a third operating mode switching the second middle side switch on and switching the high side switch, the lower side switch, and the first middle side switch off to thereby charge the second capacitor with the power, and a fourth operating mode switching the low side switch on and switching the high side switch and the first and second middle side switches off to thereby charge the third capacitor with the power.

6. The gate driving circuit of claim 1, wherein the inverter unit includes three inverter arms connected to one another in parallel.

7. The gate driving circuit of claim 6, further comprising first, second, and third gate driving units driving the switches of the three inverter arms.

8. The gate driving circuit of claim 7, further comprising first, second, and third bootstrap units dividing a voltage generated at the time of switching the plurality of switches of the three inverter arms to apply the divided voltage to respective switches and dividing the voltage applied to the first, second, and third gate driving units.

9. An inverter, comprising:
an inverter unit including at least one inverter arm having a high side switch, first and second middle side switches, and a low side switch sequentially connected in series between an input power terminal providing input power having preset voltage level and a ground, and switching the input power according to control to output an alternating current power;
at least one gate driving unit including a first high voltage gate driving unit having a plurality of high voltage gate drivers connected to one another in series between an input terminal of an instruction signal instructing switching control of the inverter unit and an output terminal of a control signal controlling switching of the inverter unit and controlling gate driving of the high side switch, a second high voltage gate driving unit having a plurality of high voltage gate drivers connected to one another in series between the input terminal of the instruction signal and the output terminal of the control signal and controlling gate driving of the first middle side switch, a high voltage gate driver controlling gate driving of the second middle side switch, and a low voltage gate driver controlling gate driving of the low side switch; and
at least one bootstrap unit dividing a voltage generated at the time of switching the plurality of switches to apply the divided voltage to respective switches according to switching control of the gate driving unit,
wherein the bootstrap unit includes:
a capacitor group including a first capacitor connected between a driving power terminal of a high voltage gate driver of the last stage of the first high voltage gate driving unit and the ground, a second capacitor connected between a driving power terminal of a high voltage gate driver of the last stage of the second high voltage gate driving unit and the ground, and a third capacitor connected between a driving power terminal of a high voltage gate driver controlling switching of the second middle side switch and the ground and connected to a driving power input terminal inputting the driving power to the high voltage gate driver of the last stage of the first high voltage gate driving unit and a driving power input terminal inputting the driving power to the high voltage gate driver of the last stage of the second high voltage gate driving unit; and
a diode group including a first diode connected between the driving power terminal of the high voltage gate driver of the last stage of the first high voltage gate driving unit and the driving power terminal of the high voltage driver of the last stage of the second high voltage gate driving unit, a second diode connected between the driving power terminal of the high voltage gate driver of the last stage of the second high voltage gate driving unit and the driving power terminal of the high voltage gate driver controlling the switching of the second middle side switch, and a third diode connected between the driving power terminal of the high voltage gate driver controlling the switching of the second middle side switch and a driving power terminal of the low voltage gate driver.

10. The inverter of claim 9, wherein the inverter includes:
a first operating mode switching the high side switch and the first middle side switch on and switching the second middle side switch and the low side switch off to thereby output alternating current power having a positive voltage level from the inverter unit and charge the first capacitor with the power;
a second operating mode switching the first and second middle side switches on and switching the high side switch and the low side switch off to thereby output the alternating current power having zero voltage level and charge the first and second capacitors with the power; and
a third operating mode switching the second middle side switch and the low side switch on and switching the high side switch and the first middle side switch off to thereby output the alternating current power having a negative voltage level and charge the second and third capacitors with the power.

11. The inverter of claim 10, wherein
the first capacitor receives the power from the second capacitor to thereby be charged with the received power, at the time of an operation in the first operating mode,
the first and second capacitors receive the power from the third capacitor to thereby to be charged with the received power, at the time of an operation in the second operating mode, and
the second and third capacitors receive the driving power to thereby be charged with the driving power, at the time of an operation in the third operating mode.

12. The inverter of claim 9, wherein the inverter includes:
a first operating mode switching the high side switch and the low side switch on and switching the first and second middle side switches off to thereby charge the third capacitor with the power,
a second operating mode switching the first middle side switch on and switching the high side switch, the low side switch, and the second middle side switch off to thereby charge the first capacitor with the power,
a third operating mode switching the second middle side switch on and switching the high side switch, the lower side switch, and the first middle side switch off to thereby charge the second capacitor with the power, and
a fourth operating mode switching the low side switch on and switching the high side switch and the first and second middle side switches off to thereby charge the third capacitor with the power.

13. The inverter of claim 12, wherein
the third capacitor receives the driving power to thereby be charged with the received driving power, at the time of an operation in the first operating mode,
the first capacitor receives the power from the second capacitor to thereby be charged with the power, at the time of an operation in the second operating mode,
the second capacitor receives the power from the third capacitor to thereby be charged with the power at the time of an operation in the third operating mode, and
the third capacitor receives the driving power to thereby be charged with the driving power, at the time of an operation in the fourth operating mode.

14. The inverter of claim 9, wherein the inverter unit includes three inverter arms connected to one another in parallel.

15. The inverter of claim 14, further comprising first, second, and third gate driving units driving the switches of the three inverter arms.

16. The inverter of claim 15, further comprising first, second, and third bootstrap units dividing a voltage generated at the time of switching the plurality of switches of the three inverter arms to apply the divided voltage to respective switches and dividing the voltage applied to the first, second, and third gate driving units.

* * * * *

UNITED STATES PATENT AND TRADEMARK OFFICE
CERTIFICATE OF CORRECTION

PATENT NO. : 9,294,007 B2
APPLICATION NO. : 13/768909
DATED : March 22, 2016
INVENTOR(S) : In Wha Jeong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 454 days.

Signed and Sealed this
Nineteenth Day of July, 2016

Michelle K. Lee
*Director of the United States Patent and Trademark Office*